BLOCKING OSCILLATOR DOUBLE PULSE GENERATOR CIRCUIT

Filed March 17, 1959 2 Sheets-Sheet 1

INVENTOR,
JOHN A. HAASE.
BY Harry M. Saragovitz
ATTORNEY

BLOCKING OSCILLATOR DOUBLE PULSE GENERATOR CIRCUIT

Filed March 17, 1959 2 Sheets-Sheet 2

INVENTOR,
JOHN A. HAASE

BY Harry M. Saragovitz

ATTORNEY

United States Patent Office 2,969,507
Patented Jan. 24, 1961

2,969,507

BLOCKING OSCILLATOR DOUBLE PULSE GENERATOR CIRCUIT

John A. Haase, Evanston, Ill., assignor, by mesne assignments, to the United States of America as represented by the United States Atomic Energy Commission Filed Mar. 17, 1959, Ser. No. 800,066
9 Claims. (Cl. 331—148)

The present invention relates to a double pulse generator, and more particularly to a double pulse generator comprising a blocking oscillator utilizing a feedback circuit to provide means for producing a second pulse within the recovery of time of the blocking oscillator.

In the blocking oscillator circuits of the prior art the spacing between the output pulses was set by the time constant determined by the resistor and capacitor forming the biasing circuit.

The present invention utilizes a passive network to control the spacing between the original pulses derived from the blocking oscillator, and further utilizes the original pulses to trigger a circuit from which other pulses are initiated. These other pulses are delayed and then applied to the input of the blocking oscillator, with the result that the output from the blocking oscillator circuit contains twice the number of pulses originally initiated by the blocking oscillator itself.

An object of the present invention is to provide an improved blocking oscillator circuit in which the spacing between the generated pulses may be readily controlled.

Another object of the present invention is to provide a feedback circuit in a blocking oscillator circuit so that a second pulse can be produced from the blocking oscillator circuit within the recovery time of the blocking oscillator.

Still another object of the present invention is to provide means to permit a blocking oscillator to produce a shorter pulse-time interval and thus an increased repetition rate.

A still further object of the present invention is to provide means for developing additional pulses to be superimposed between the normal pulses derived from a blocking oscillator.

The exact nature of this invention as well as other objects and advantages thereof will be readily apparent from consideration of the following specification relating to the annexed drawings, in which.

The blocking oscillator circuit or pulse generator of this invention is employed as a source of plate voltage for a superregenerative receiver operating in the UHF band of frequencies. Pulse operation allows the receiver to discriminate in time against unwanted signals of a pulse nature, while doubly occurring sensitive periods may be weighed against one another to eliminate C.W. interference. In such a receiver the voltage pulses from the pulse generator can gate a tube off and on at specific time intervals, allowing other pulses to be received if they fall within these time intervals. It can therefore be seen that unwanted signal pulses, unless they fall within the "on" time of the gated receiver, would not be received.

Figures 1, 2:
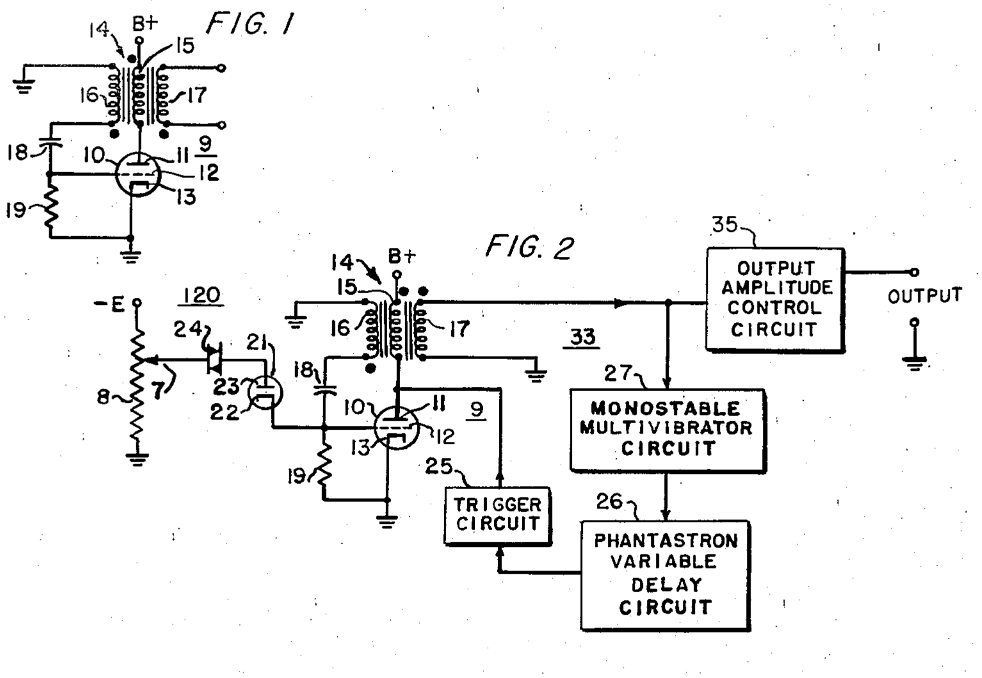
Figure 1 is a schematic diagram of a conventional blocking oscillator.
Figure 2 is a diagram of the blocking oscillator circuit of the present invention; partly in schematic form and partly in block form.

Referring now to the drawings, wherein like reference characters designate like or corresponding parts throughout the several views, there is shown in Fig. 1 a conventional blocking oscillator circuit 9, which will be used for comparison purposes to explain the novel features of the invention. This circuit includes triode 10 having plate 11, grid 12, and cathode 13; and a transformer 14 having plate winding 15, grid winding 16 and output winding 17. Plate winding 15 of transformer 14 is connected between plate 11 of triode 10 and the plate B+ supply voltage. One end of grid winding 16 is electrically connected by grid capacitor 18 to grid 12 of triode 10. The other end of grid winding 16 and cathode 13 are connected to ground. Grid resistor 19 is connected between grid 12 and ground.

The dots at each winding indicate similar polarities. For example, if current flows through one winding so that the dot end is positive, the field set up in the core induces voltages in the other windings making the dot end positive in these windings at the same time.

Figure 3:
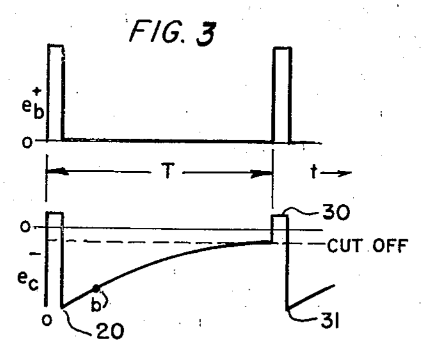
Figure 3 illustrates the plate voltage ($e_b$) and grid voltage ($e_c$) waveforms of the blocking oscillator circuit of Figure 1.

In describing the operation of blocking oscillator circuit 9 in Fig. 1, let it be assumed that grid capacitor 18 has been negatively charged (point 20 in Fig. 3) by a preceding cycle. Triode 10, therefore, is biased well below cut-off. As the charge on grid capacitor 18 leaks off (the plate of capacitor 18 connected to grid 12 becomes less negative) through grid resistor 19, the biasing voltage is reduced (made more positive) to the point where triode 10 begins to conduct (the cut-off as shown in Fig. 3 is reached). The plate current sets up a magnetic field around plate winding 15 of transformer 14. This magnetic field builds from zero to maximum in direct proportion to the plate current, and therefore induces a voltage in grid winding 16. This voltage is impressed on grid 12 of triode 10 through grid capacitor 18 with a polarity that drives grid 12 more and more positive as the magnetic field in plate winding 15 is built up. Grid 12, when driven positive with respect to cathode 13, draws current, and electrons accumulate on the plate of grid capacitor 18 nearest grid 12. As the plate current reaches saturation (point 30 in Fig. 3), the magnetic field in plate winding 15 ceases to increase.

For an instant there is no induced voltage in grid winding 16, and, because no charging potential is applied, grid capacitor 18 begins to discharge and the plate of capacitor 18 connected to grid 12 starts becoming negative. This discharge causes the positive potential on grid 12 to become less positive, thereby causing less plate current to flow in plate winding 15. The magnetic field around plate winding 15 starts to collapse which, in turn, induces a voltage in grid winding 16 in the reverse direction, causing grid 12 to become more and more negative. This process continues until grid 12 is driven beyond cut-off (i.e., beyond cut-off to point 31 in Figure 3), thus completing a cycle of operation. Oscillation does not start again immediately, however, because the grid current, when grid 12 is positive, builds up enough charge on grid capacitor 18 (the plate of capacitor 18 connected to grid 12 becomes charged negatively) to hold triode 10 cut-off until some of the charge leaks off through grid resistor 19.

The duration of each blocking oscillator pulse (pulse width) depends mainly on the magnetizing inductance and resistance of transformer 14, and, to a lesser extent, on the size of the grid capacitor 18. The time between pulses (the natural period T of the oscillator) is governed by the values of resistance (transformer resistance and grid resistor 19) and grid capacitance (grid capacitor 18), since these values also govern the rate of change of $e_c$ (grid voltage). However, because of the pulse width requirements, the grid capacitor 18 is fixed. Therefore, the time between pulses is determined primarily by the value of resistance.

It can be seen from the foregoing discussion of the conventional blocking oscillator that the time between pulses is limited by the R–C time time constant. It will now be shown how the present invention will permit the time between pulses to be reduced.

Referring to Figure 2, there is shown a blocking oscillator similar to that of Figure 1, but having a non-linear circuit 120 connected between grid 12 of triode 10 and a negative supply voltage −E. This oscillator circuit also includes an output loop coupled back to transformer 14. The non-linear circuit comprises diode 21 in series with varistor (non-linear resistor) 24 and potentiometer 8, connected across negative supply −E. Cathode 22 of diode 21 is connected to the junction of grid resistor 19 with grid capacitor 18. Varistor 24 is connected between slider arm 7 of potentiometer 8 and plate 23.

Trigger circuit 25, phantastron variable delay circuit 26, and cathode-coupled monostable multivibrator circuit 27 form feedback loop 33. These components are discussed in more detail in connection with Figure 6. They are connected in series between plate 11 of triode 10 and output winding 17. The junction of output winding 17 and cathode-coupled monostable multi-vibrator circuit 27 is connected through output amplitude control circuit 35 to the output terminals.

One feature of the invention, as disclosed in Figure 2, is the use of varistor 24, a non-linear resistor which has the property of changing conductance with the instantaneous applied voltage. The varistor has the property of being bilateral, i.e., independent of voltage polarity or current sense. Therefore, it must be employed with a unilateral device such as diode 21 to affect only the negative portion of the grid voltage wave.

Figure 5A:
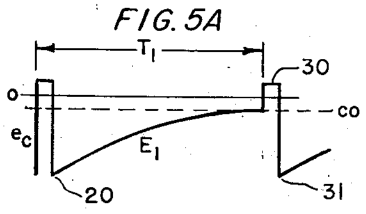
Figures 5A and 5B show a comparison of the grid voltage on the grid of the triode of Figure 2 for different values of bias voltage applied to the grid circuit.

During the negative portion of each grid voltage cycle, when the grid voltage exceeds, in a negative sense, the back bias voltage on diode 21, varistor 24 parallels grid resistor 19. This condition begins somewhere between zero time and point 20 in Figure 5A depending on the setting of potentiometer 8. Thus, as the grid voltage proceeds in a negative sense, the plate capacitor 18 connected to grid 12 becomes more negative and the discharge path for grid capacitor 18 becomes a parallel combination of grid resistor 19 and varistor 24 in series with the diode 21 forward resistance. The latter, being negligible, allows grid capacitor 18 to rapidly discharge (the plate of capacitor 18 connected to grid 12 becomes less negative) through the low resistance of varistor 24 to point 20 in Figure 5A. As the grid voltage increases from its most negative value (point 20 in Figure 5A) and approaches the value set by slider 7, the varistor impedance rises. When the grid voltage and the voltage at slider 7 become equal, the back resistance of diode 21 in series with the varistor impedance is in parallel with grid resistor 19. This results in capacitor 18 discharging more slowly. Therefore, the discharge of capacitor 18 occurs in two phases, one rapid, and the other slow.

Figure 5B:
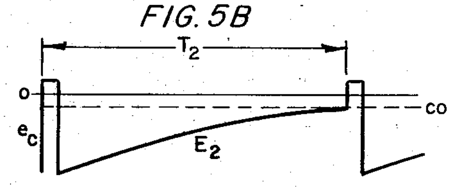

The relative time spent in each phase is controlled by the amount of bias applied to diode 21; hence the total period, T, is a function of this bias. This can be seen by referring to Figures 5A and 5B in which there are shown two curves of grid voltage vs. impressed voltage −E (negative supply voltage). It should be noted that $-E_2$ is greater than $-E_1$, i.e., in a negative sense, while $T_2$ is greater than $T_1$.

The other important feature of the present invention, as disclosed in Figure 2, is the utilization of feedback loop 33 (connected between output winding 17 of transformer 14 and plate 11 of triode 10) comprising a conventional cathode-coupled monostable multivibrator circuit 27 which is triggered by each original output pulse from blocking oscillator 9; a conventional phantastron variable delay circuit 26 which is triggered by the output from cathode coupled monostable multivibrator circuit 27; and a conventional parallel trigger tube circuit 25 (for example another blocking oscillator) which is triggered by the output from phantastron variable delay circuit 26.

Figure 4:
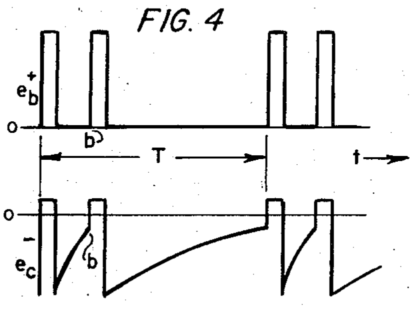
Figure 4 illustrates the plate voltage ($e_b$) and grid voltage ($e_c$) waveforms of the blocking oscillator circuit of Figure 2.

Cathode coupled monostable multivibrator circuit 27 and phantastron variable delay circuit 26 make it possible to generate a second pulse closely following the first, Figure 4, or original pulse by utilizing the first pulse as a delayed trigger. Cathode-coupled monostable multivibrator circuit 27 discriminates against more than one output pulse so that production of a second pulse, which is desired, does not cause a third, fourth, fifth, etc., to occur also. This is accomplished because of the slow speed of recovery due to the charging of the timing condenser in cathode coupled monostable multivibrator circuit 27. Only the first or original pulse and not the second pulse (derived pulse) will trigger cathode coupled monostable multivibrator circuit 27 since the separation between these two pulses is smaller than the recovery time of cathode coupled monostable multivibrator circuit 27. Phantastron variable delay circuit 26 introduces the delay which determines the spacing between pulses and also the components essential to re-trigger the blocking oscillator when the selected time delay has elapsed. The delayed pulse from phantastron delay circuit 26 is applied to parallel trigger tube circuit 25, the output from this being applied to plate 11 of triode 10. This trigger tube's grid voltage must have a fast rise time to cause the output to be similar to the output from the blocking oscillator. Thus, the double pulse generator or blocking oscillator yields two output pulses per period.

Figure 6:
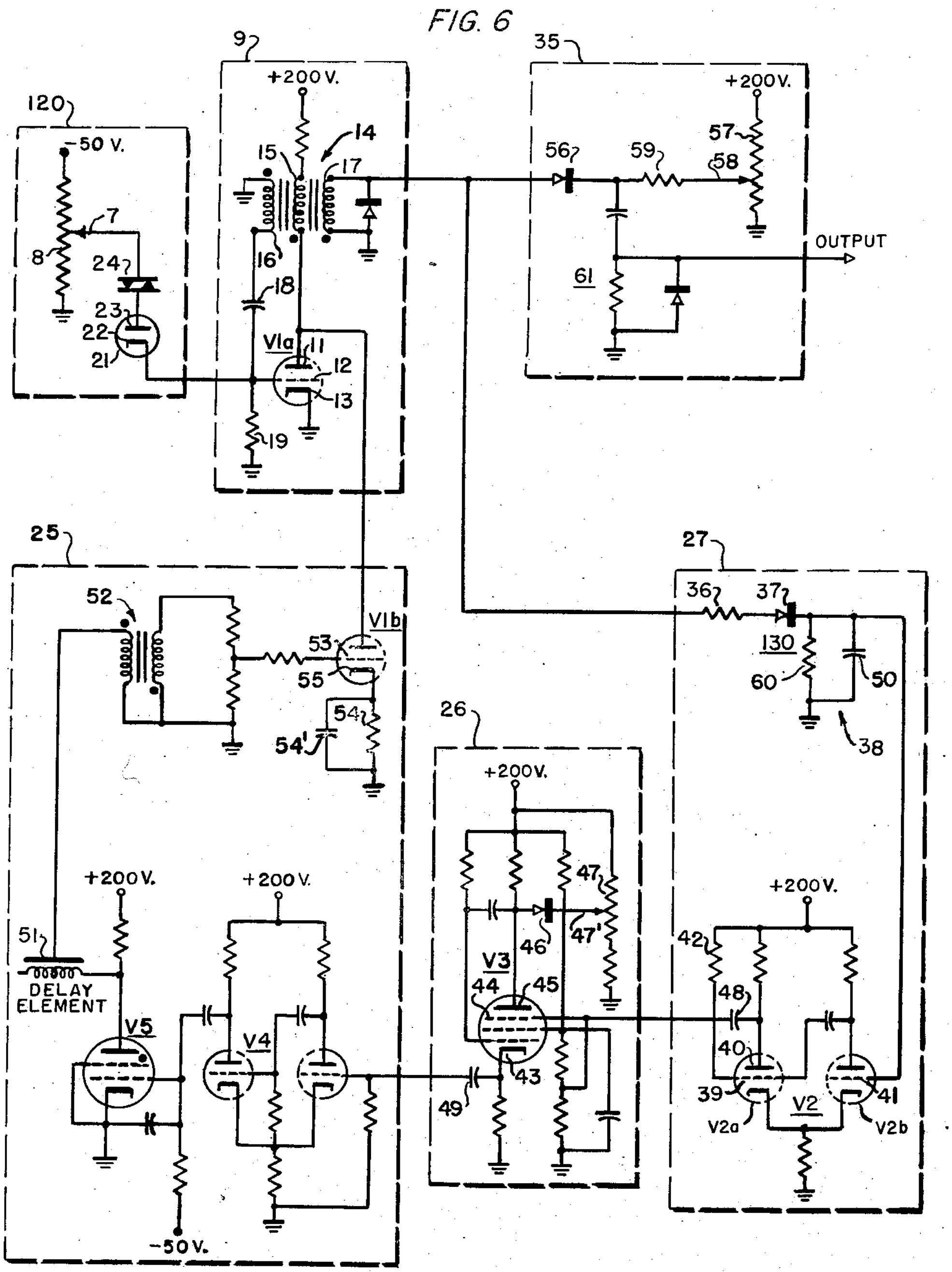
Figure 6 is a schematic drawing of Figure 2 showing certain elements of Figure 2 in more detail.

Reference is now made to Figure 6, which discloses circuits 25, 26, 27 and 35 of Figure 2 in detail. Blocking oscillator circuit 9 is connected to the inputs of multivibrator circuit 27 and output amplitude control circuit 35. Multivibrator circuit 27 comprises, essentially, tubes $V_{2a}$ and $V_{2b}$, and their related circuitry, along with the resistor 36, and charge-holding network 130 comprising diode 37 (preferably type 1N39) and parallel resistive-capacitive (R–C) network 38. R–C network 38 comprises resistor 60 and capacitor 50 and is connected between grid 41 and ground, and resistor 36 is connected in series with diode 37 between output winding 17 of transformer 14 of blocking oscillator 9 and grid 41. Grid 39 is electrically connected to a D.-C. supply voltage (+200 volts) through resistor 42 thereby rendering $V_{2a}$ normally conducting.

Triode $V_{1a}$ (10 in Figure 2) generates a single positive pulse at plate 11 having a duration of only a fraction of a microsecond. This pulse is applied through transformer 14 to grid 41 via resistor 36 and charge holding circuit 130. Capacitor 50 of charge holding circuit 130 will charge up quickly through diode 37 and will discharge slowly through resistor 60. Thus, the duration of the positive pulse is increased enough to allow the pulse to trigger multivibrator $V_{2a}$ and $V_{2b}$ from its normal state to its quasi-stable state. This change of state of the multivibrator from stable to quasi-stable and then back to stable causes a sharp positive pulse to appear at the plate of $V_{2a}$.

While $V_{2b}$ remains conducting in the quasi-stable state, it is insensitive to other positive pulses from $V_{1a}$. Thus, only the first, or "free running" pulse in each cycle may reproduce itself; the second evokes no change at multivibrator $V_2$ and the chain of response is cut. Of course, multivibrator $V_2$ recovers in time to commence the next cycle.

The output from multivibrator circuit 27 is taken from plate 40 of $V_{2a}$ and coupled by capacitor 48 to the input of phantastron variable delay circuit 26. Phantastron variable delay circuit 26 comprises, essentially, pentode $V_3$ having a cathode 43, suppressor grid 44 and plate 45; plate-catching diode 46 (preferably type 1N39) and potentiometer 47. A D.-C. supply voltage (+200 volts) is connected across the two fixed terminals of potentiometer 47, and plate-catching diode 46 is connected between slider arm 47′ of potentiometer 47 and plate 45. These connections allow a variable, lower limit to be placed upon the plate voltage and thereby permit control of the delay interval, $\Delta t$. The rate of fall of the plate voltage remains constant. Thus, with the output from multivibrator circuit 27 applied to suppressor grid 44, and by the proper adjustment of potentiometer 47, at time $t=b$ (Figures 3 and 4) a positive-going signal will be developed on cathode 43. This signal is coupled to trigger circuit 25 by capacitor 49.

Trigger tube circuit 25 includes monostable multivibrator $V_4$, thyratron $V_5$ and parallel trigger tube $V_{1b}$. Multivibrator $V_4$ intervenes between phantastron variable delay circuit 26 and thyratron $V_5$ to provide the latter with a steeply rising trigger voltage. The output voltage from thyratron $V_5$ is applied through delay line element 51 and transformer circuit 52 to grid 53 of parallel trigger tube $V_{1b}$. Thyratron $V_5$ produces at grid 53 of parallel trigger tube $V_{1b}$ a voltage having a fast rise time by discharging delay element 51 which parallels it. The discharge begins when multivibrator $V_4$ initiates a positive pulse and so overcomes the negative grid bias voltage (−50 volts) on thyratron $V_5$. It is necessary that the voltage applied to grid 53 have a fast rise time in order that outputs from $V_{1a}$ will be similar for each pulse.

A resistive-capacitive (R-C) circuit 54 and 54′ is connected to cathode 55 of trigger tube $V_{1b}$ to provide a long time constant therefor and prevent the potential on cathode 55 from changing value while grid 53 is driven highly positive. Thus, a large plate current passes through plate winding 15 of transformer 14, inducing a positive voltage at grid 12 of triode $V_{1a}$, and starting the second operation of blocking oscillator circuit 9, i.e., the generation of the second pulse of the pulse pair.

Non-linear circuit 120 of Figure 6 is identical to that of Figure 2, the operation of which has already been described.

In order that the amplitude of the two output pulses per period can be varied continuously between a maximum value and zero, output amplitude control circuit 35 is connected to the output of blocking oscillator circuit 9. Output amplitude control circuit 35 comprises diode 56 (preferably type 1N92), potentiometer 57 with a slider arm 58, resistor 59, and filter circuit 61. Resistor 59 is connected between one end of diode 56 and slider arm 58. Diode 56 has its other end connected to output winding 17 of transformer 14. Filter network 61 is connected between the junction of diode 56 with resistor 59 and ground. A utilization device (not shown in Figure 6) would be connected to filter network 61 to receive the two output pulses per period generated by the circuit of the present invention. A D.-C. supply voltage is connected across the two fixed terminals of potentiometer 57. This potentiometer controls the back-biasing voltage on diode 56 to permit the final output voltage amplitude applied to filter circuit 61 to be varied continuously between a maximum (no bias) and zero (full bias).

While the circuit disclosed herein generated sets of two identical pulses per period, it is apparent that sets of 3, 4, 5 or more pulses might be produced, but with an increased penalty by the complication of the retrigger circuitry. Therefore, it should be understood that numerous modifications or alterations may be made in the preferred embodiment of the present invention without departing from the spirit and scope of the invention as set forth in the appended claims.

What is claimed is:

1. In a pulse generator circuit which includes a tube having a grid and a plate, a series resistor and capacitor timing network coupled to said grid, a plural-winding transformer having one winding coupled to said plate and a feed-back winding coupled to said network, the improvement comprising means for enabling the pulse generator circuit to shorten the discharge time of said network, said means including a diode coupled to said grid, a source of negative potential, and a non-linear resistance means coupled between said diode and said source of potential.

2. In a pulse generating blocking oscillator circuit including an electron discharge device having a grid and a plate, and a feed-back network electrically connected between said grid and said plate for sustaining oscillations of said oscillator: a pulse-space adjusting network electrically connected to said feedback network to adjust the discharge time-constant thereof, said pulse space adjusting network comprising a varistor, a diode connected between one terminal of said varistor and said feed-back network, and a source of negative potential connected to the other terminal of said varistor for biasing said diode.

3. A pulse generator comprising an electron discharge device having a grid, a plate and a cathode; a feed-back circuit including a transformer and a resistor-capacitor network, said transformer having at least a first and a second winding, said first winding being electrically connected to said plate, said second winding being electrically connected between said cathode and one end of the capacitor of said resistor-capacitor network, said capacitor having its other end electrically connected to said grid, the resistor of said resistor-capacitor network being electrically connected between said other end of said capacitor and said cathode; and means for adjusting the spacing between pulses, said means comprising a varistor, a diode connected between said grid and one end of said varistor, and a source of negative potential connected to the other end of said varistor for biasing said diode.

4. In a double pulse generator circuit which includes a blocking oscillator tube having a plate, a plural-winding transformer having one winding coupled to said plate and an output winding: an electrical feed-back loop connected between a terminal of said output winding and said plate to permit a second pulse to be produced from said blocking oscillator circuit within the recovery time of said blocking oscillator circuit, said feed-back loop comprising a multivibrator circuit coupled to said output winding to be triggered thereby, a delay circuit coupled to said multivibrator for delaying the output therefrom, a trigger circuit connected between said delay circuit and said plate for applying a potential to said plate when activated by a pulse applied from said delay circuit.

5. The double pulse generator of claim 4 wherein said multivibrator circuit includes a one-shot multivibrator having a slow speed of recovery.

6. In a double pulse generator which includes a blocking oscillator circuit having a tube with a plate and a grid and a transformer having an output winding connected to said plate: means for adjusting the spacing between normal pulses derived from said blocking oscillator circuit, said means comprising a varistor, a diode connected between said varistor and said grid and a source of negative potential connected to said varistor for biasing said diode; and a feed-back loop to permit a second pulse to be produced from said blocking oscillator circuit within the recovery time of said blocking oscillator circuit, said feed-back loop being connected across said output winding.

7. A double pulse generator comprising: a blocking oscillator circuit, including an electron discharge device having a plate, a grid and a cathode, a resistor connected between said cathode and said grid, a transformer having a plate winding, a grid winding and an output winding, a capacitor connected between said grid and one terminal of said grid winding, said cathode and the other terminal of said grid winding being electrically at ground potential, said plate winding being connected to said plate, said output winding having one terminal at ground potential; a pulse spacing adjusting circuit connected in parallel with said resistor to regulate the discharge time of said capacitor; and a feed-back loop network connected between the other terminal of said output winding and said plate, for utilizing original pulses from said output winding to initiate other pulses within the recovery time of said blocking oscillator circuit.

8. The double pulse generator of claim 7 wherein said feed-back loop network comprises a multivibrator circuit connected to said other terminal of said output winding, a phantastron delay circuit connected to the output of said multivibrator circuit, and a trigger circuit connected between said plate and the output of said phantastron delay circuit.

9. The double pulse generator of claim 8 further comprising means to permit said multivibrator to be triggered only by said original pulses and wherein said pulse spacing adjusting circuit comprises a varistor, a diode connected between said varistor and said grid, and a negative source of D.-C. potential connected to said varistor for biasing said diode.

References Cited in the file of this patent

UNITED STATES PATENTS

| | | |
|---|---|---|
| 2,181,568 | Kotowski et al. | Nov. 28, 1939 |
| 2,889,454 | Hoffman et al. | June 2, 1959 |